(12) United States Patent
Hwang et al.

(10) Patent No.: US 8,686,296 B2
(45) Date of Patent: Apr. 1, 2014

(54) ELECTRONIC DEVICE HAVING HEAT DISSIPATION DEVICE

(75) Inventors: Ching-Bai Hwang, New Taipei (TW); Jui-Wen Hung, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 65 days.

(21) Appl. No.: 13/340,614

(22) Filed: Dec. 29, 2011

(65) Prior Publication Data

US 2013/0118781 A1 May 16, 2013

(30) Foreign Application Priority Data

Nov. 11, 2011 (TW) .............................. 100141264 A

(51) Int. Cl.
*H05K 1/00* (2006.01)
*F28F 9/00* (2006.01)

(52) U.S. Cl.
USPC ............................................ 174/252; 165/67

(58) Field of Classification Search
USPC ........................................ 174/252; 165/67–68
See application file for complete search history.

(56) References Cited

U.S. PATENT DOCUMENTS

2012/0216988 A1* 8/2012 Kang et al. ...................... 165/67

* cited by examiner

*Primary Examiner* — Jeremy Norris
(74) *Attorney, Agent, or Firm* — Novak Druce Connolly Bove + Quigg LLP

(57) ABSTRACT

An exemplary heat dissipation device includes a bracket, and heat sink and a pressing member. The bracket includes a bottom plate. An opening is defined in the bottom plate. Two supporting portions are formed from an underside of the bottom plate. The heat sink extends through the opening of the bracket, with bottom edges of the heat sink rested on the supporting portions. The pressing member is mounted on the bracket and elastically presses the heat sink onto the supporting portions.

20 Claims, 5 Drawing Sheets

ELECTRONIC DEVICE HAVING HEAT DISSIPATION DEVICE

BACKGROUND

1. Technical Field

The present disclosure relates to an electronic device having a heat-generating component and a heat dissipation device dissipating the heat generated from the component.

2. Description of Related Art

With advancements in computer technology, many modern electronic devices such as central processing units and chips operate rapidly. It is well known that the more rapidly the electronic devices operate, the more heat they generate. If the heat is not dissipated properly, the stability of the electronic device may be impacted severely.

What is needed, therefore, is an electronic device to overcome the described disadvantages.

DETAILED DESCRIPTION

Figure 1:
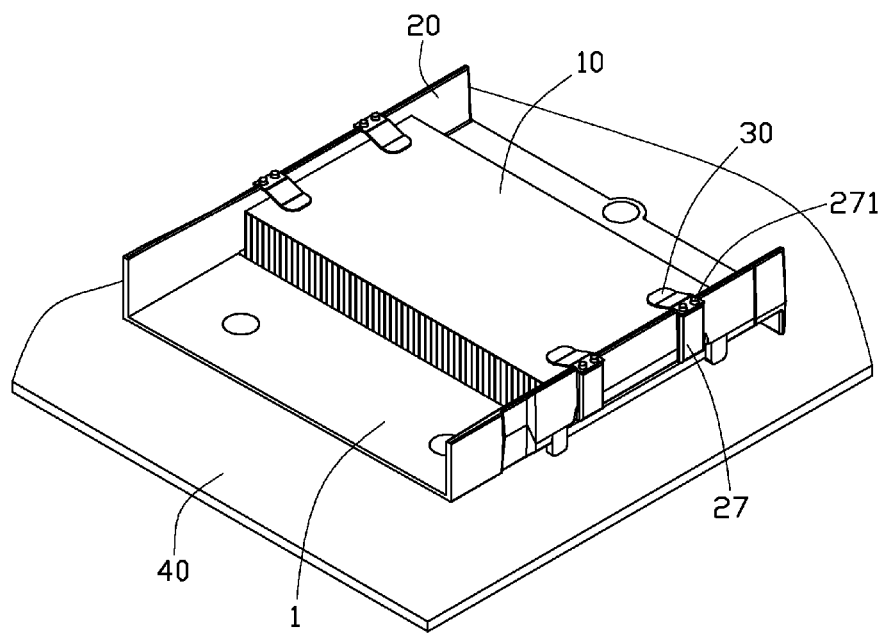
FIG. 1 is an assembled view of an electronic device of an embodiment of the present disclosure, the electronic device including a printed circuit board and a heat dissipation device.
Figure 5:
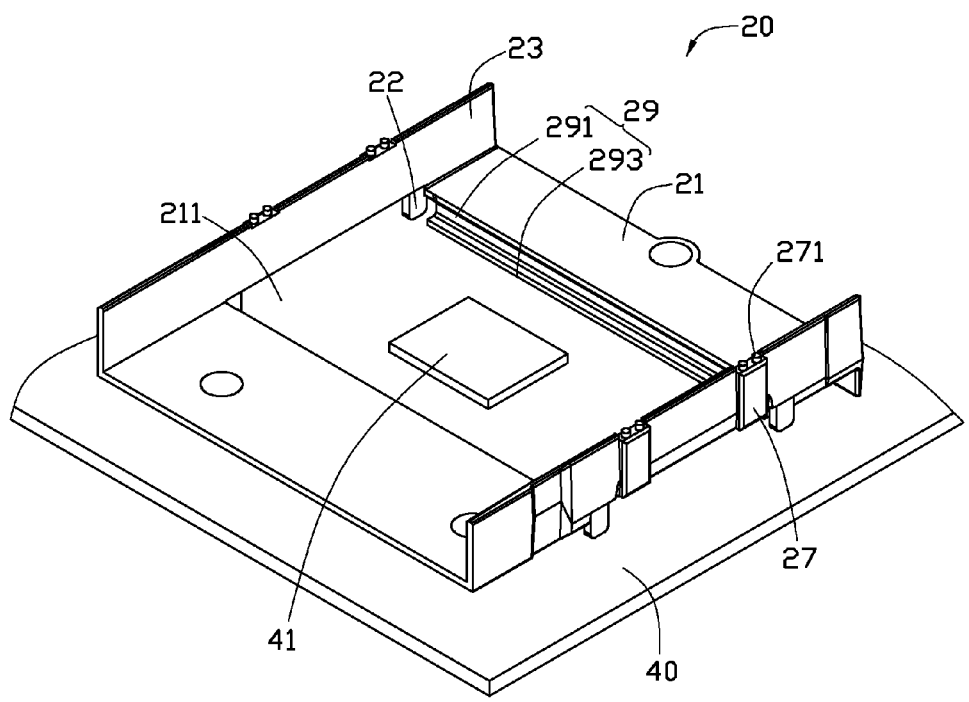
FIG. 5 shows the bracket of the heat dissipation device and an electronic component mounted on the printed circuit board of FIG. 1.

Referring to FIG. 1, an electronic device of the present disclosure is shown. Referring also to FIG. 5, the electronic device comprises a printed circuit board (PCB) 40 and a heat dissipation device 1 mounted on the PCB 40 to contact an electronic component 41. The heat dissipation device 1 includes a heat sink 10, a bracket 20 and a plurality of pressing members 30. The bracket 20 supports the heat sink 10 and is mounted on the PCB 40. The pressing members 30 engage with the bracket 20 and press the heat sink 10 to secure the heat sink 10 on the bracket 20.

Figure 3:
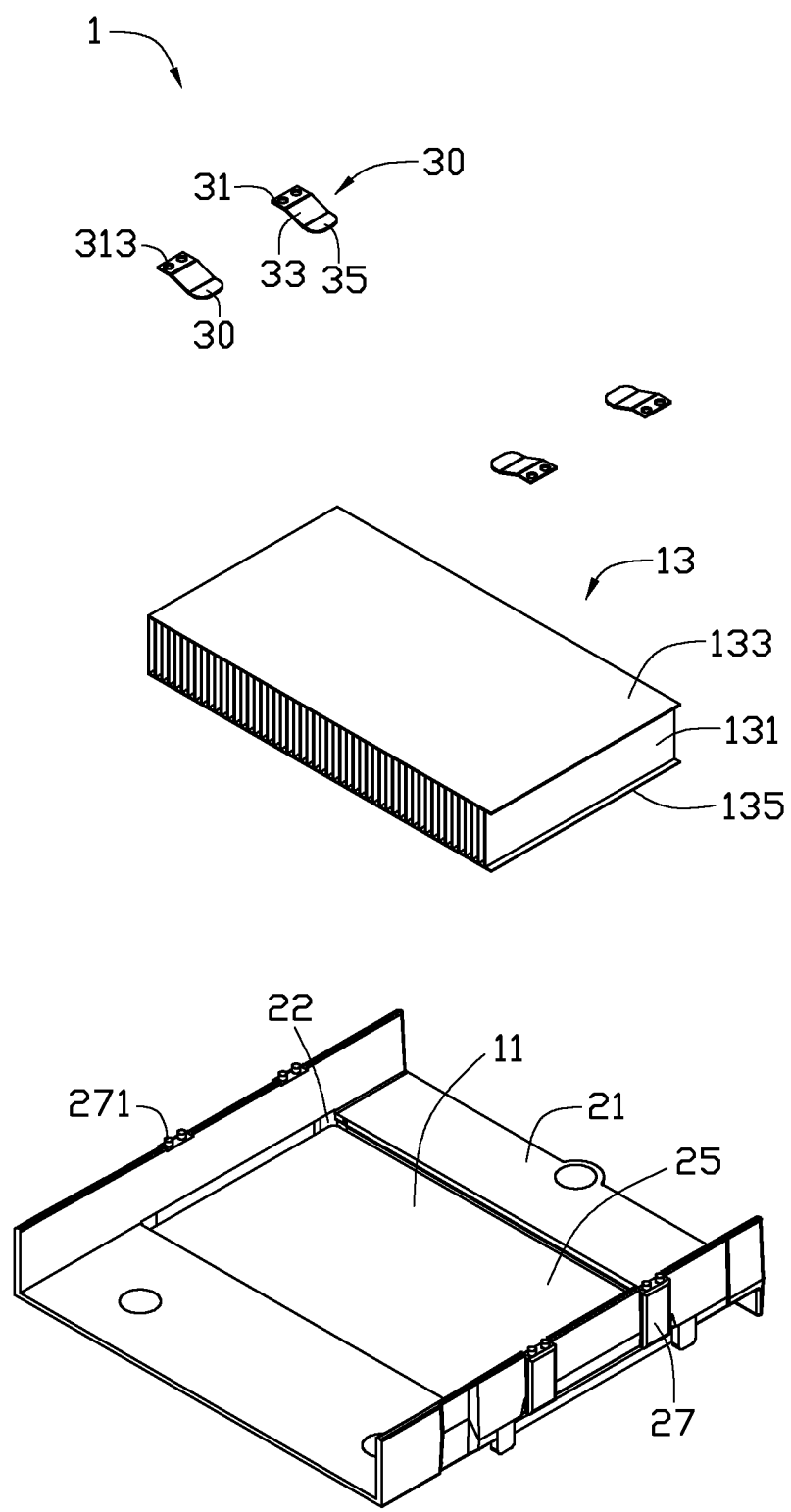
FIG. 3 is an exploded view of the heat dissipation device of FIG. 1.
Figure 4:
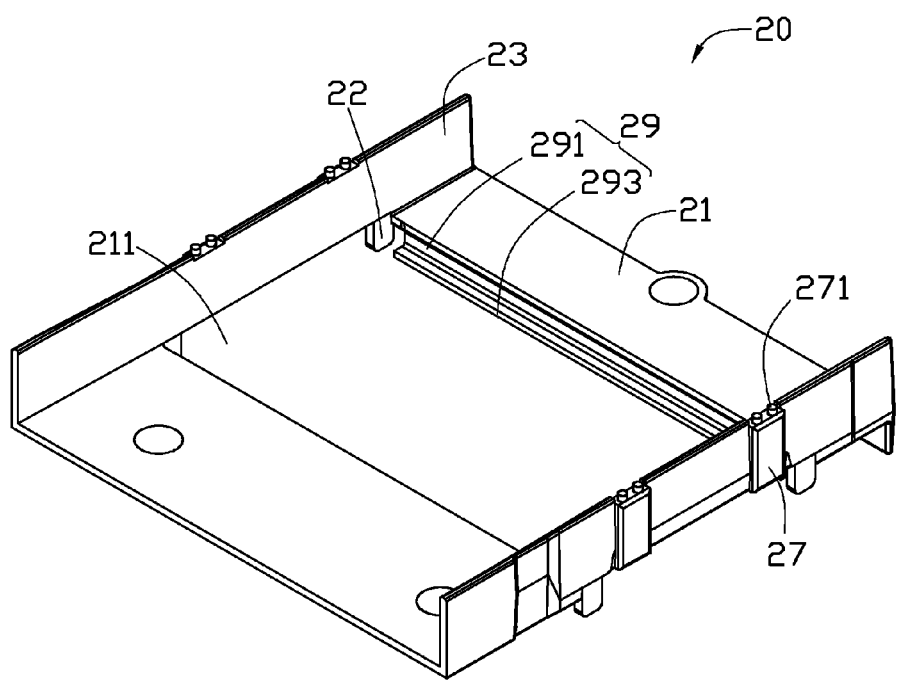
FIG. 4 is an isometric view of a bracket of the heat dissipation device of FIG. 3.

Referring also to FIGS. 3-4, the bracket 20 is a metal die-casting piece, and includes a bottom plate 21 and two sidewalls 23 perpendicularly extending from opposite sides of the bottom plate 21. The bottom plate 21 is rectangular. A plurality of mounting posts 24 extends downwardly from a bottom surface of the bottom plate 21 and engages with the PCB 40, to mount the bracket 20 on the PCB 40. Two rectangular protruding portions 27 are formed on an outer surface of each of the sidewalls 23, with the two protruding portions 27 being spaced from each other. A top end of each protruding portion 27 and a top edge (surface) of the corresponding sidewall 23 are coplanar. Two spaced engaging posts 271 are formed on the top end of the protruding portion 27, to engage with a corresponding one of the pressing members 30. A rectangular opening 211 is defined in a central portion of the bottom plate 21 to receive the heat sink 10 therein.

Referring to FIG. 5, two supporting portions 29 extend downwardly from an underside of the bottom plate 21 near opposite edges of the opening 211, respectively, for supporting the heat sink 10. Each supporting portion 29 includes an elongated connecting plate 291 and an elongated supporting plate 293. The connecting plate 291 extends perpendicularly downwardly from the bottom plate 21 near one of the edges of the opening 211. A length of the connecting plate 291 is slightly smaller than that of the edge of the opening 211. The supporting plate 293 extends perpendicularly inward from the connecting plate 291, and is thus parallel to the bottom plate 21. A transverse cross section of each supporting portion 29 (including the supporting plate 293 and the connecting plate 291) has an L-shaped configuration. A height of each connecting plate 291 along a direction perpendicular to the bottom plate 21 is equal to that of each mounting post 24. When fasteners (not shown), such as screws, extend through the PCB 40 and engage in the mounting posts 24, the bracket 20 is mounted on the PCB 40. In this state, the supporting plates 293 rest on the PCB 40, and the electronic component 41 of the PCB 40 is positioned between the supporting plates 293.

Four restricting plates 22 extend downwardly from the sidewalls 23, at four corners of the opening 211, respectively. Each supporting portion 29 is located between two corresponding restricting plates 22, and opposite ends of the supporting portion 29 are spaced from the restricting plates 22. A height of each restricting plate 22 along the direction perpendicular to the bottom plate 21 is equal to or slightly less than that of the connecting plate 291 of the corresponding supporting portion 29.

Figure 2:
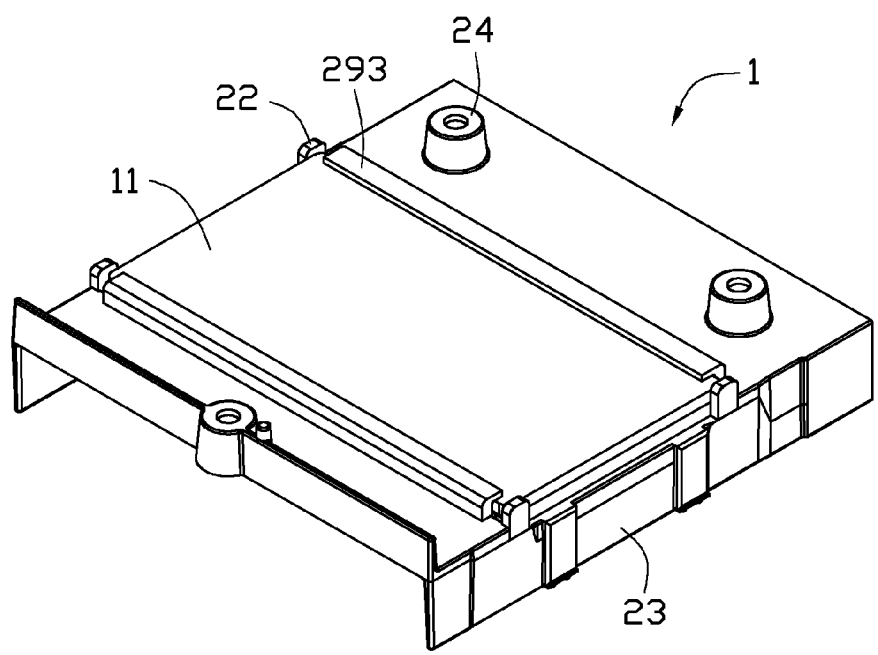
FIG. 2 is an inverted view of the heat dissipation device of FIG. 1.

Referring also to FIGS. 2-3, the heat sink 10 includes a base 11 and a fin group 13 mounted on a top side of the base 11. The base 11 is made of copper. A transverse width of the base 11 is less than or equal to a distance between inner surfaces of the connecting plates 291 of the supporting portions 29. A length of the base 11 is slightly less than a distance between an inner surface of each one of the restricting plates 22 extending from one of the sidewalls 23 and an inner surface of a corresponding opposite restricting plate 22 extending from the other sidewall 23. A thickness of the base 11 is less than a distance between a top surface of the supporting plate 293 of each supporting portion 29 and a top surface of the bottom plate 21 of the bracket 20. When the base 11 is mounted on the bracket 20, two edges of a bottom surface of the base 11 rest on the supporting plates 293, lateral sides of the base 11 abut bottom portions of the inner surfaces of the connecting plates 291, and front and rear ends of the base 11 abut the restricting plates 22. A center portion of the bottom surface of the base 11 directly contacts the electronic component 41. Top portions of the inner surfaces of the connecting plates 291 and a top surface of the base 11 corresponding to the opening 211 cooperatively define a receiving chamber 25 therebetween.

Referring to FIGS. 1 and 3, the fin group 13 is made of aluminum and includes a top sheet 133, a bottom sheet 135, and a plurality of fins 131 sandwiched between the top sheet 133 and the bottom sheet 135. The fins 131 are spaced from each other and opposite ends thereof respectively connect the top sheet 133 and the bottom sheet 135. The bottom sheet 135 is mounted on the top surface of the base 11. The bottom sheet 135 with a bottom portion of the fin group 13 is received in the receiving chamber 25. A top portion of the fin group 13 is located above the bottom plate 21 of the bracket 20 and below the top edges of the sidewalls 23.

Each of the pressing members 30 is an elastic plate, and includes an engaging plate 31, an extending plate 33, and a pressing plate 35. The engaging plate 31 is rectangular, and two spaced through holes 313 are defined in the engaging plate 31. A diameter of each through hole 313 is slightly less than a diameter of a corresponding one of the engaging posts 271 of the bracket 20. Two corresponding such engaging posts 271 are inserted into the through holes 313 and interferingly engage with the engaging plate 31. Thus, the pressing member 30 is mounted on the bracket 20. The extending plate 33 is rectangular, and extends downwardly and outwardly from an inner edge of the engaging plate 31 towards the top sheet 133 of the heat sink 10. The pressing plate 35 extends from an inner edge of the extending plate 33. Thus, the pressing plate 35 and the engaging plate 31 are located at opposite sides of the extending plate 33. The pressing plate 35 presses the top sheet 133 of the heat sink 10. The pressing members 30 press the heat sink 10 downwardly to make the bottom surface of the base 11 intimately contact the electronic component 41.

In this disclosure, the heat sink 10 absorbs heat generated from the electronic component 41 of the PCB 40 to avoid the electronic component 41 overheating. Thus the stability of the electronic device having the electronic component 41 can be improved.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device for dissipating heat of an electronic component of an electronic device, the heat dissipation device comprising:
   a bracket comprising a bottom plate, an opening being defined in the bottom plate, and two supporting portions being formed from an underside of the bottom plate at opposite sides of the opening;
   a heat sink extending through the opening of the bracket, with bottom edges of the heat sink resting on the supporting portions; and
   a pressing member mounted on the bracket and elastically downwardly pressing the heat sink onto the supporting portions;
   wherein each supporting portion comprises a connecting plate extending downwardly from the bottom plate and a supporting plate extending inward toward the opening from the connecting plate, whereby a transverse cross section of the supporting portion has an L-shaped configuration, the supporting plates of the supporting portions rest on a printed circuit board and support the heat sink thereon, and lateral sides of the heat sink abut the connecting plates.

2. The heat dissipation device of claim 1, wherein the pressing member comprises an engaging plate mounted on the bracket, an extending plate extending from the engaging plate and oriented towards the heat sink, and a pressing plate extending from the extending plate and pressing a top side of the heat sink.

3. The heat dissipation device of claim 2, wherein the bracket further comprises two sidewalls extending up from opposite sides of the bottom plate, the supporting portions and the sidewalls are located at four edges of the opening respectively, two engaging posts are formed on one of sidewalls of the bracket, two through holes are defined in the engaging plate, and the engaging posts extend through the through holes and are interferingly engaged with the engaging plate.

4. The heat dissipation device of claim 3, wherein the supporting portions extend downwardly from the underside of the bottom plate near two opposite edges of the opening.

5. The heat dissipation device of claim 4, wherein each supporting portion comprises a connecting plate extending downwardly from the bottom plate and a supporting plate extending inward toward the opening from the connecting plate, and the heat sink comprises a base, edges of a bottom surface of the base resting on the supporting plates of the supporting portions, and lateral sides of the base abutting against bottom portions of the connecting plates of the supporting portions.

6. The heat dissipation device of claim 5, wherein the heat sink further comprises a fin group mounted on a top surface of the base, the pressing plate pressing a top side of the fin group.

7. The heat dissipation device of claim 6, wherein the base is made of copper, and the fin group is made of aluminum.

8. The heat dissipation device of claim 1, wherein four restricting plates are formed on the bracket at four corners of the opening, each supporting portion is located between two corresponding restricting plates, and opposite ends of the heat sink abut the restricting plates.

9. The heat dissipation device of claim 8, wherein a height of each restricting plate along a direction perpendicular to the bottom plate is equal to or slightly less than that of the corresponding supporting portion.

10. An electronic device comprising:
    a printed circuit board comprising an electronic component mounted thereon; and
    a heat dissipation device comprising:
    a bracket comprising a bottom plate, an opening being defined in the bottom plate, and two supporting portions formed from an underside of the bottom plate and resting on the printed circuit board, the electronic component being exposed by the opening;
    a heat sink extending through the opening of the bracket and confronting the supporting portions, a bottom of the heat sink directly contacting the electronic component; and
    a pressing member mounted on the bracket and pressing the heat sink downwards to make the heat sink intimately contact the electronic component;
    wherein each supporting portion comprises a connecting plate extending downwardly from the bottom plate and a supporting plate extending inward toward the opening from the connecting plate, whereby a transverse cross section of the supporting portion has an L-shaped configuration, the supporting plates of the supporting portions rest on the printed circuit board and support the heat sink thereon, and lateral sides of the heat sink abut the connecting plates.

11. The electronic device of claim 10, wherein the heat sink comprises a base, edges of a bottom surface of the base resting on the supporting plates of the supporting portions, and lateral sides of the base abutting against bottom portions of the connecting plates of the supporting portions.

12. The electronic device of claim 11, wherein the heat sink further comprises a fin group mounted on a top surface of the base, and the pressing plate presses a top side of the fin group.

13. The electronic device of claim 10, wherein the bracket further comprises two sidewalls extending up from opposite sides of the bottom plate, the supporting portions and the sidewalls are located at four edges of the opening respectively, and the pressing member is mounted on a top end of one of the sidewalls and presses the heat sink onto the supporting portions.

14. The electronic device of claim 13, wherein four restricting plates are formed on the bracket at four corners of the opening, each supporting portion is located between two corresponding restricting plates, and opposite ends of the heat sink abut the restricting plates.

15. The electronic device of claim 14, wherein a height of each restricting plate along a direction perpendicular to the bottom plate is equal to or slightly less than that of the corresponding supporting portion.

16. The electronic device of claim 13, wherein the pressing member comprises an engaging plate mounted on the corresponding sidewall, an extending plate extending from the engaging plate and oriented towards the heat sink, and a pressing plate extending from the extending plate and pressing a top side of the heat sink.

17. The electronic device of claim 16, wherein two engaging posts are formed on the corresponding sidewall of the bracket, two through holes are defined in the engaging plate, and the engaging posts extend through the through holes and are interferingly engaged with the engaging plate.

18. The electronic device of claim 10, wherein the pressing member is an elastic plate.

19. The electronic device of claim 10, wherein a plurality of mounting posts are formed on a bottom surface of the bottom plate and rest on the printed circuit board.

20. A heat dissipation device comprising:
a bracket comprising a bottom plate, an opening being defined in the bottom plate, and a pair of supporting portions being formed from an underside of the bottom plate at opposite sides of the opening;
a heat sink defining a rectangular shape and extending through the opening of the bracket, with bottom edge regions of the heat sink respectively resting upon the supporting portions; and
a pressing member mounted on the bracket and elastically pressing the heat sink unto the supporting portions; wherein
each of said supporting portions extends along a corresponding edge of the opening with a length across a centerline of said bracket, and the bottom edge region of the heat sink rests vertically upon the corresponding supporting portion with said length; wherein
the opening is configured and dimensioned similar to the rectangular shape of the heat sink to compliantly receive said heat sing therein.

* * * * *